(12) United States Patent
Cotte et al.

(10) Patent No.: US 6,454,869 B1
(45) Date of Patent: Sep. 24, 2002

(54) PROCESS OF CLEANING SEMICONDUCTOR PROCESSING, HANDLING AND MANUFACTURING EQUIPMENT

(75) Inventors: John Michael Cotte, New Fairfield, CT (US); Dario L. Goldfarb, Putnam Valley, NY (US); Kenneth John McCullough, Fishkill, NY (US); Wayne Martin Moreau, Wappinger, NY (US); Keith R. Pope, Danbury, CT (US); John P. Simons; Charles J. Taft, both of Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 30 days.

(21) Appl. No.: 09/893,206

(22) Filed: Jun. 27, 2001

(51) Int. Cl.[7] .................................................. B08B 3/04
(52) U.S. Cl. .............................. 134/2; 134/36; 134/34; 134/22.19; 134/42; 134/902
(58) Field of Search .............................. 134/2, 36, 34, 134/22.19, 42, 902

(56) References Cited

U.S. PATENT DOCUMENTS

| | | | | |
|---|---|---|---|---|
| 5,698,040 A | * | 12/1997 | Guldi et al. | 134/1.3 |
| 5,766,061 A | * | 6/1998 | Bowers | 451/189 |
| 5,846,338 A | * | 12/1998 | Bonora et al. | 734/11 |
| 5,866,005 A | * | 2/1999 | Desimone et al. | 210/634 |
| 5,908,510 A | * | 6/1999 | McCullough et al. | 134/2 |
| 5,976,264 A | * | 11/1999 | McCullough et al. | 134/2 |

OTHER PUBLICATIONS

Spall et al. "A survey on theuse of supercritical carbon dioxide as a cleaning solvent", Supercrit. Fluid Clean. (1998), 162–194.*

* cited by examiner

*Primary Examiner*—Sharidan Carrillo
(74) *Attorney, Agent, or Firm*—Scully, Scott, Murphy & Presser; Daniel P. Morris

(57) ABSTRACT

A process of cleaning semiconductor processing, handling and manufacturing equipment in which such equipment is contacted with a cleaning effective amount of liquid or supercritical carbon dioxide.

9 Claims, 4 Drawing Sheets

PROCESS OF CLEANING SEMICONDUCTOR PROCESSING, HANDLING AND MANUFACTURING EQUIPMENT

BACKGROUND OF THE DISCLOSURE

1. Field of the Invention

The present invention is directed to a process of cleaning semiconductor processing, handling and manufacturing equipment and wafer handling devices. More specifically, the present invention is directed to a process of cleaning semiconductor processing, handling and manufacturing equipment by contacting such equipment with liquid or supercritical carbon dioxide.

2. Background of the Prior Art

Although fabrication of semiconductor devices takes various forms, two steps, the penultimate and ultimate steps, are common to all such production. That is, all semiconductor processing steps ends with a rinsing penultimate step in which deionized water, solvents and acids are employed. The ultimate step is the removal of such water, solvents and acids. These two steps involve waste streams which must be treated, incinerated or segregated for disposal. In addition, of course, the cost of these processing fluids only add additional cost to the high disposal cost such that the combined expense of rinsing and cleaning represents a significant percentage of the total cost of producing semiconductor devices.

These problems are magnified by the requirement that semiconductor processing, handling and manufacturing equipment employed in forming semiconductor devices be similarly cleaned. That such equipment also need be scrupulously cleaned is apparent to those skilled in the art since such cleaning insures that future semiconductor devices processed, manufactured and handled by this equipment is not contaminated, and thus its effectiveness compromised, by foreign material remaining thereon.

Indeed the cleaning of semiconductor processing, handling and manufacturing equipment represents a significant environmental and economical consideration in its own right. Equipment of this type is immense compared to semiconductor devices. Oftentimes, this equipment, which is bulky, expensive and complex, must be cleaned in sequential cleaning operations employing multiple vessel cleaning configurations. As such, the quantity of cleaning fluids required is quite considerable.

It is therefore apparent to those skilled in the art that there is a significant need in the art for an improved process of cleaning semiconductor processing, handling and manufacturing equipment to reduce the significant economic charges and environmental dangers involved in cleaning such equipment.

BRIEF SUMMARY OF THE INVENTION

A new process has now been developed to replace solvent rinsing and subsequent drying steps associated with the cleaning of semiconductor processing, handling and manufacturing equipment. This new process overcomes the considerable expense of utilizing solvent rinses as well as the attendent environmental difficulties associated with release of these solvents to the atmosphere.

In accordance with the present invention a process of removal of processing of semiconductor processing, handling and manufacturing equipment is provided. In this process semiconductor processing, handling and manufacturing equipment which have been contacted with semiconductor processing fluids are contacted with an equipment cleaning effective amount of liquid carbon dioxide or supercritical carbon dioxide.

BRIEF DESCRIPTION OF THE DRAWINGS

The present invention may be better understood by reference to the accompanying drawings of which.

DETAILED DESCRIPTION

The process of the present invention, the cleaning of semiconductor processing, handling and manufacture equipment, involves the utilization of liquid carbon dioxide or supercritical carbon dioxide. In either case, thermodynamic conditions consistent with the maintenance of carbon dioxide in one of these states must be provided during this cleaning operation. This is so insofar as carbon dioxide in the liquid or supercritical state has remarkable solvating properties, being able to penetrate into spaces that traditional solvents cannot reach. Moreover, this remarkable property is accompanied by the complete removal of the carbon dioxide as a gas when exposed to ambient conditions.

Figure 1:
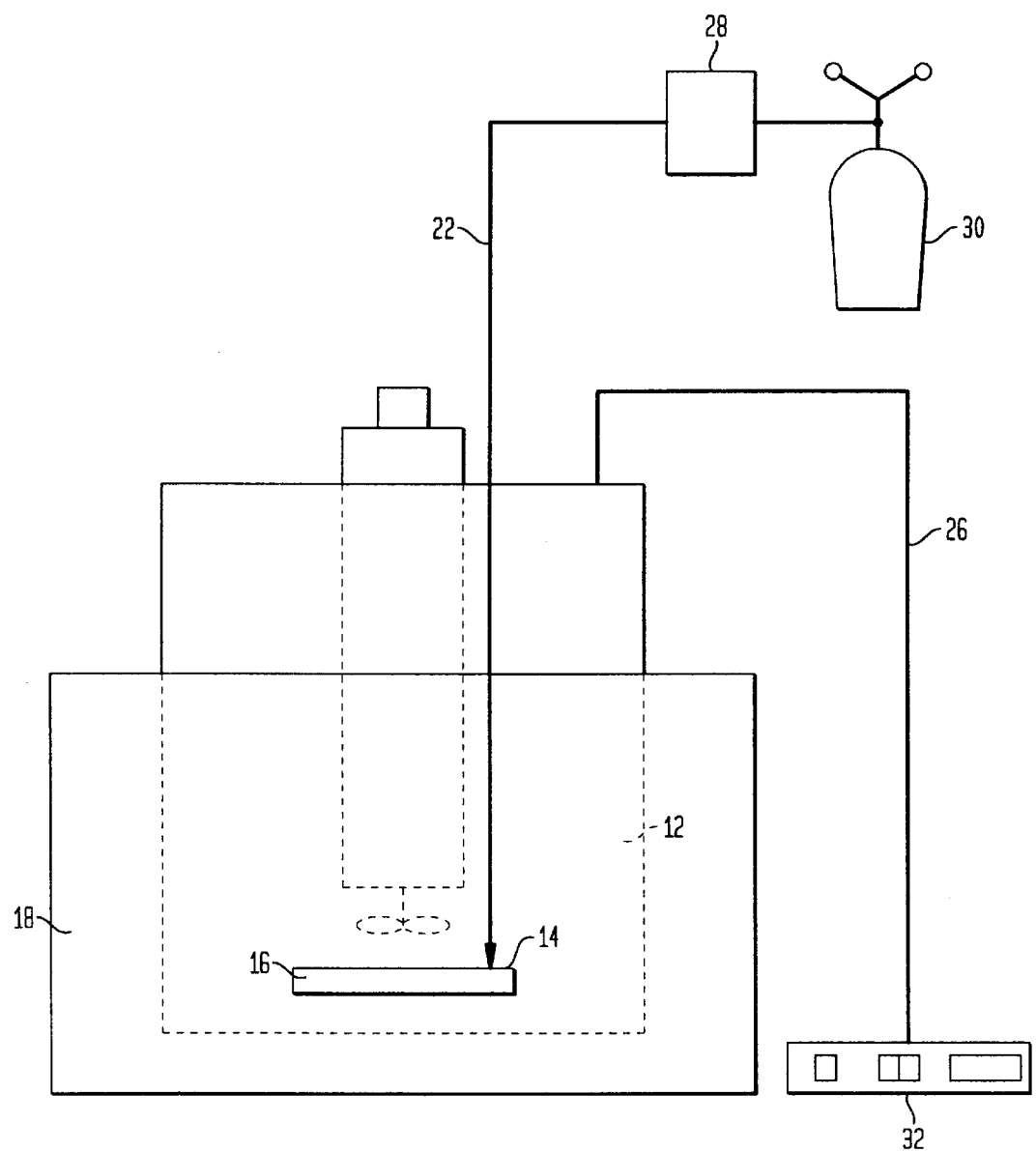
FIG. 1 is a schematic representation of an apparatus suitable for cleaning semiconductor processing, handling and manufacturing equipment in accordance with the process of the present invention.
Figure 2:
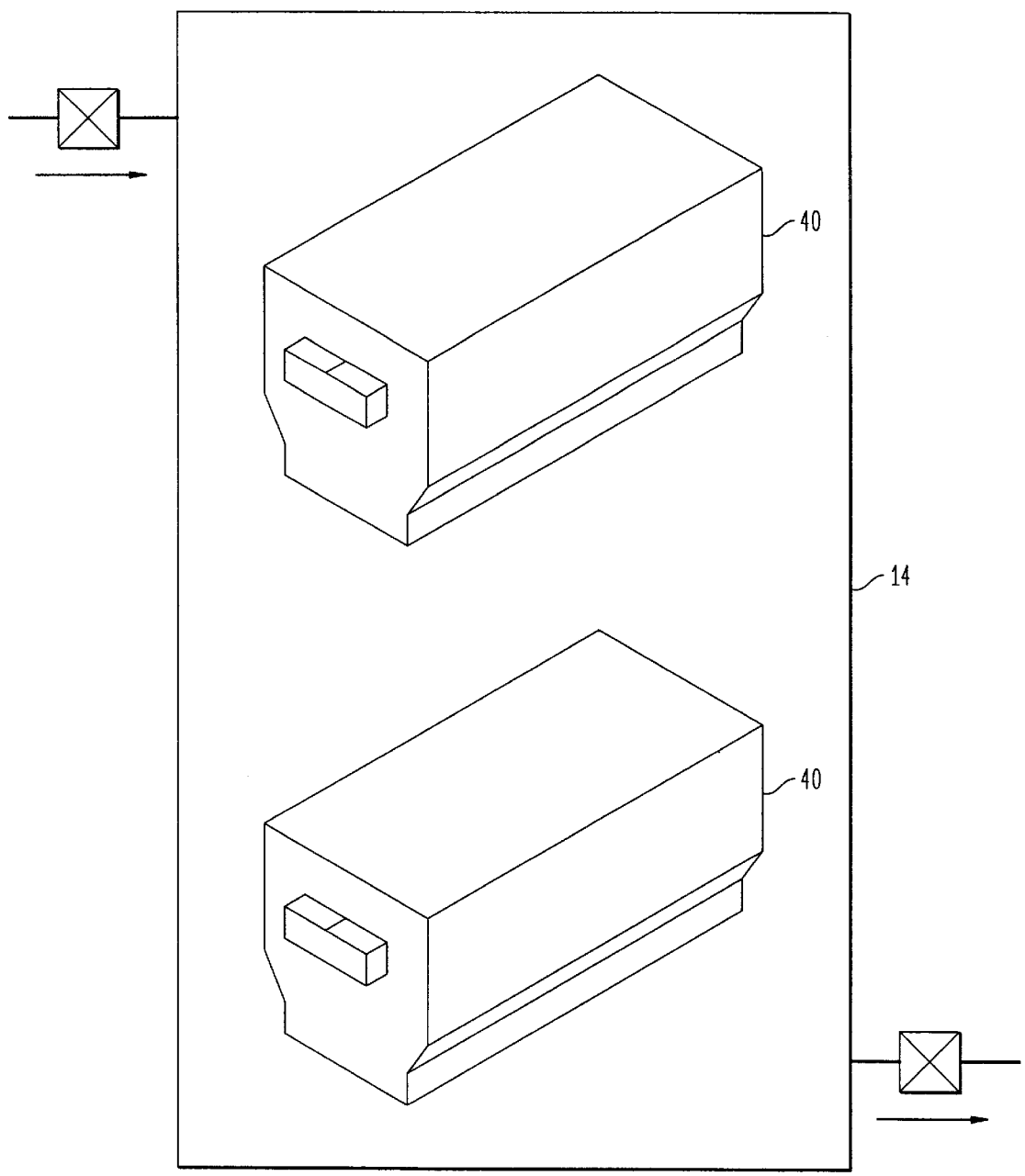
FIG. 2 is a schematic representation of a processing chamber of the apparatus of FIG. 1 illustrating cleaning of a type of semiconductor handling equipment.

The process of the present invention is conducted in an apparatus of the type illustrated by FIG. 1. Therein, semiconductor processing, handling and manufacturing equipment 16 to be cleaned is introduced into a cleaning zone 14 of a processing chamber 12 wherein the equipment 16 is exposed to liquid carbon dioxide or supercritical carbon dioxide. To ensure that the liquid carbon dioxide and supercritical carbon dioxide remains in the liquid or supercritical state during processing, the processing chamber 12 is maintained at a pressure in the range of between about 1,000 psi and about 6,000 psi. More preferably, the pressure within processing chamber 12 is in the range of between about 2,000 psi and about 5,000 psi. Still more preferably, the pressure within processing chamber 12 is about 3,000 psi. The temperature within processing chamber 12 is maintained in a range of between about 40° C. and about 100° C. Preferably, the temperature within process chamber 12 is maintained in a range of between about 50° C. and about 80° C. Still more preferably, the temperature within processing chamber 12 is in the range of about 70° C.

Since it is critical that these thermodynamic conditions be maintained during the process of the present invention, process chamber 12 may be controlled by a heat controller 32 which has the capability to monitor the temperature in chamber 12 by means of a thermocouple 26. The measured temperature is adjusted by heat jacket 18, controlled by controller 32, in accordance with temperature control means well known in the art.

Liquid or supercritical carbon dioxide is provided into processing chamber 12 by means of a liquid or supercritical carbon dioxide source 30 As shown in FIG. 1, the liquid or supercritical carbon dioxide may be pre-pressurized by a high pressure pump 28 disposed downstream of the source of the liquid or supercritical carbon dioxide 30. The high pressure liquid or supercritical carbon dioxide is conveyed into processing chamber 12 by means of conduit 22. It is noted in passing that means are provided for the introduction of additional components, provided by a source 36, through conduit 37, in communication with conduit 22. In the embodiment wherein a composition is provided this means for introduction of additional components may come into play.

It is emphasized that the liquid or supercritical carbon dioxide may be recycled to provide a closed system. In that preferred embodiment a reservoir 34 is provided. Reservoir 34 collects and/or purifies liquid or supercritical carbon dioxide that exits processing chamber 12 through outduct 24. The liquid or supercritical carbon dioxide is recycled back into processing chamber 12 through conduit 35.

The semiconductor processing, handling and manufacturing equipment 16 to be cleaned in accordance with the present invention, as stated above, is introduced into sample zone 14 of the chamber 12 wherein it is exposed to liquid or supercritical carbon dioxide. One preferred class of equipment 16 which is cleaned in accordance with the process of the present invention is wafer cassettes 40. Wafer cassettes are open containers having means for accommodating a plurality of semiconductor wafers. These cassettes, employed in moving wafers from one to another processing step, are the depository of residue that fall off the wafers in transit. Since the cassettes 16 are of relatively large size, a large cleaning zone 14 must be provided in chamber 12 to accommodate the cassettes during cleaning.

Figure 3:
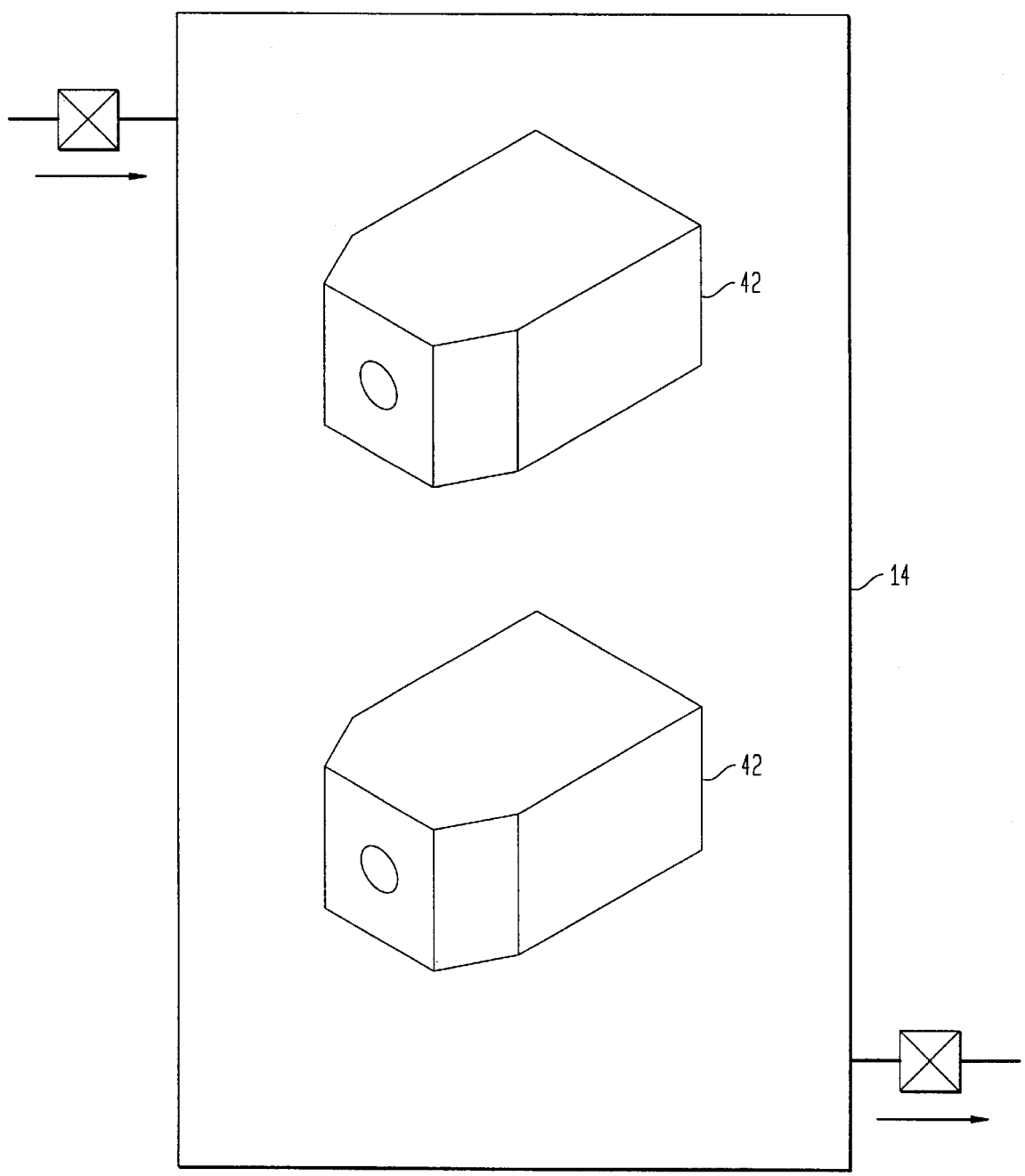
FIG. 3 is a schematic representation of a processing chamber of the apparatus of FIG. 1 illustrating cleaning of another type of semiconductor handling equipment.

A second example of semiconductor handling equipment that is cleaned in accordance with the present invention are wafer foups. Wafer foups are closed containers which, like wafer cassettes, hold a plurality of semiconductor wafers. However, wafer foups, illustrated in FIG. 3 by reference numeral 42, have evolved as the most commonly employed containers of 300 mm diameter semiconductor wafers. Wafer foups is an acronym for a front opening unified pod and, given their closed design, are difficult to clean using the aqueous rinse method of the prior art.

Figure 4:
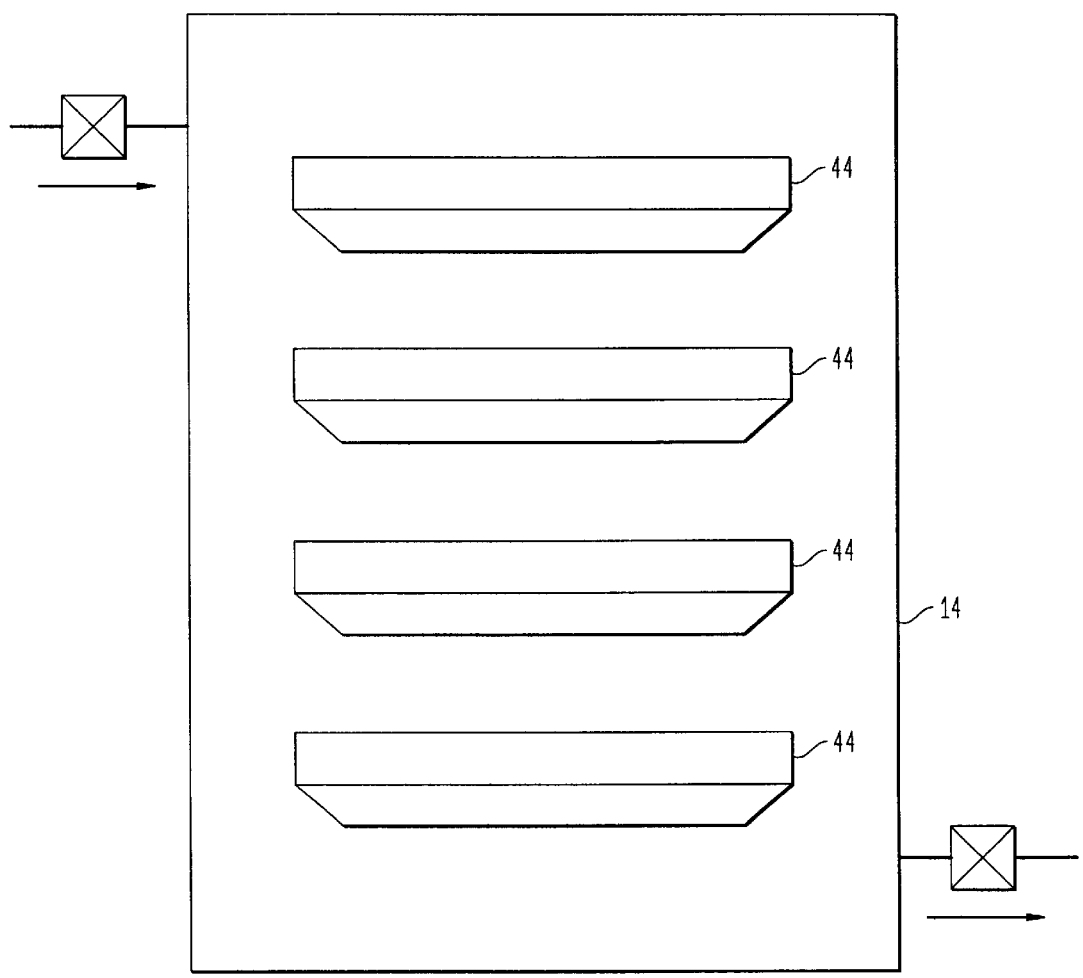
FIG. 4 is a schematic representation of a processing chamber of the apparatus of FIG. 1 illustrating cleaning of a type of semiconductor processing equipment.

A third example of semiconductor equipment, well suited for cleaning in accordance with the process of the present invention, is equipment associated with photoresist coating. As those skilled in the art are aware, coating of semiconductor wafers with photoresists is a critical processing step in the formation of semiconductor chips. Typically, a photoresist is cast upon semiconductor wafers while the wafers are rotated to provide a uniform coating thereupon. Such turntable assemblies are schematically represented at 44 in FIG. 4. Obviously, these assemblies are contacted with photoresist residue which falls off wafers during application. As such, they are ideal candidates for cleaning in accordance with the process of the present invention.

The latter embodiment, wherein photoresist is a contaminant which is cleaned in accordance with the present invention, illustrates the desirability of a preferred embodiment of the process of the present invention. A photoresist may be better processed when the liquid or supercritical carbon dioxide contacts the photoresist in the presence of a surfactant. Thus, in a preferred embodiment of the present invention, the cleaning agent is a liquid or supercritical carbon dioxide composition which includes a surfactant.

The surfactant employed in the liquid or supercritical carbon dioxide composition is present in a concentration in the range of between about 0.01% and about 50% by weight, based on total weight of the composition. More preferably, the surfactant composition is in the range of between about 0.1% and about 25% by weight. Still more preferably, the concentration is in range of between about 0.1% and about 5%. Yet still more preferably, the surfactant constituent is present in an amount of between about 0.1% and about 1%. Most preferably, the surfactant constituent represents between about 0.1% and about 0.5% by weight. It is emphasized that all of the foregoing concentrations are based on the total weight of the composition.

Surfactants within the contemplation of the present invention include polyethers, siloxanes, fluoroalkanes, reaction products thereof and mixtures thereof. Although many polyether, siloxane and fluoroalkane surfactants known in the art are useful in the present invention, certain of these surfactants are particularly preferred for utilization in the process of the present invention. For example, amongst polyether surfactants, polyalkylene oxides are preferred. Thus, such polyethers as poly(ethylene oxide) (PEO), poly (propylene oxide) (PPO) and polybutylene oxide) (PBO) are particularly preferred. Block polymers of these polyalkylene oxides, such as (PPO-b-PEO-b-PPO) and (PEO-b-PPO-b-PEO), where the "b" denotes block, i.e. Pluorinic® triblock copolymers, and (PBO-b-PEO) are particularly preferred. Another polyether surfactant particularly useful in the present invention combines a polyether with a fluorine-containing polymer. That surfactant is perfluoropolyether ammonium carboxylate.

Turning to fluorine-containing polymers, several fluoroalkanes are useful as the surfactant of the present invention. Among the fluoroalkane polymers, such species as 4-(perfluoro-2-isopropyl-1,3-dimethyl-1-butenyloxy) benzoic acid (PRBA) and 4-(perfluror-2-isopropyl-1,3-dimethyl-1-butenyloxy)benzene sulfonic acid (PFBS) find particular application as the surfactant of the composition of the present invention.

Amongst the siloxanes preferred for utilization as the surfactant of the composition of the present invention, preference is given to such species as poly (dimethylsiloxane) (PDMS) copolymers. As stated above, combinations of these surfactants are preferred. Thus, the combination of a siloxane and a polyether such as PMDS with PEO-PPO, e.g. (PDMS-g-PEO-PPO), where "g" indicates graft, is particularly desirable.

The composition employed in the process of the invention can, in addition to supercritical or liquid carbon dioxide and a surfactant, include a further component, a co-solvent. The co-solvent is employed to dissolve the surfactant. However, the co-solvent must be inert to the chemically reactive photoresist material. Inert solvents useful employed in the composition of the process of the present invention are those inert solvents which are highly miscible with the surfactant. Particularly, preferred solvents useful in the composition of the process of the present invention are inert hydrocarbons. Thus, such aromatic or aliphatic hydrocarbons as cyclohexane and xylene are particularly preferred co-solvents.

In addition to inert hydrocarbons, other solvents that can be employed in the composition of the present invention are fluorinated hydrocarbons. Fluorinated hydrocarbons share the advantageous properties of hydrocarbons with the added advantage that they are more miscible in carbon dioxide than are unsubstituted hydrocarbons. Fluorinated hydrocarbons useful in the composition include compounds having the formula $CF_3(CF_2)_nCF_3$, where n is 2 to 6. Of these, perfluorohexane and perfluoroheptane are particularly preferred.

A co-solvent, if present in the composition, is preferred to be present in a concentration is in the range of between about 1% and about 25% by volume, based on the total volume of the co-solvent and supercritical or liquefied carbon dioxide. More particularly, the concentration of the co-solvent is in the range of between about 5% and about 10% by volume, based on the total volume of the co-solvent and supercritical or liquid $CO_2$. Most preferably, the co-solvent is present in a concentration of between about 6% and about 8% by volume, based on the total volume of the solvent and the supercritical or liquid $CO_2$.

The above embodiments are provided to illustrate the scope and spirit of the present invention. These embodiments will make apparent, to those skilled in the art, other embodiments and examples. These other embodiments and examples are within the contemplation of the present invention. Therefore, the present invention should be limited only by the appended claims.

What is claimed is:

1. A process of cleaning semiconductor processing, handling and manufacturing equipment comprising contacting semiconductor processing, handling and manufacturing equipment selected from the group consisting of wafer foups and turntable assemblies within which photoresists are cast with a composition which comprises carbon dioxide in the liquid or supercritical state, a surfactant selected from the group consisting of polyethers, siloxanes, fluoroalkanes and mixtures thereof and a co-solvent selected from the group consisting of inert hydrocarbons and fluorinated hydrocarbons.

2. A process in accordance with claim 1 wherein said contact occurs at a pressure in the range of between about 1,000 psi and about 6,000 psi and at a temperature in the range of between about 40° C. and about 100° C.

3. A process in accordance with claim 1 wherein said equipment is a wafer foup.

4. A process in accordance with claim 1 wherein said equipment is a turntable assembly within which photoresists are cast.

5. A process in accordance with claim 1 wherein said co-solvent is an inert hydrocarbon selected from the group consisting of an aliphatic hydrocarbon and an aromatic hydrocarbon.

6. A process in accordance with claim 1 wherein said co-solvent is an inert hydrocarbon selected from the group consisting of cyclohexane and xylene.

7. A process in accordance with claim 1 wherein said co-solvent is a fluorinated hydrocarbon having the structural formula $CF_3(CF_2)_nCF_3$, where n is 2 to 6.

8. A process in accordance with claim 1 wherein said surfactant is a polyether and is a polyalkylene oxide.

9. A process in accordance with claim 7 wherein said fluorinated hydrocarbon is perfluorohexane or perfluoroheptane.

* * * * *